(12) United States Patent
King et al.

(10) Patent No.: US 10,114,392 B2
(45) Date of Patent: Oct. 30, 2018

(54) VARIABLE RATIO CHARGE PUMP WITH PEAK CURRENT AND AVERAGE CURRENT LIMITING CIRCUITRY

(71) Applicant: Cirrus Logic International Semiconductor Ltd., Edinburgh (GB)

(72) Inventors: Eric J. King, Austin, TX (US);
Christian Larsen, Austin, TX (US);
Aaron J. Brennan, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/800,743

(22) Filed: Nov. 1, 2017

(65) Prior Publication Data
US 2018/0120884 A1 May 3, 2018

Related U.S. Application Data

(60) Provisional application No. 62/416,971, filed on Nov. 3, 2016.

(51) Int. Cl.
*H02M 3/07* (2006.01)
*G05F 1/573* (2006.01)
*F04D 15/00* (2006.01)
*H02M 1/32* (2007.01)
*H03F 3/217* (2006.01)
*H03K 17/16* (2006.01)
(Continued)

(52) U.S. Cl.
CPC ....... *G05F 1/5735* (2013.01); *F04D 15/0027* (2013.01); *H02M 1/32* (2013.01); *H02M 3/07* (2013.01); *H03F 1/025* (2013.01); *H03F 3/2171* (2013.01); *H03F 3/72* (2013.01); *H03K 17/167* (2013.01)

(58) Field of Classification Search
CPC combination set(s) only.
See application file for complete search history.

(56) References Cited

U.S. PATENT DOCUMENTS 8,264,273 B2 * 9/2012 MacFarlane ............ H02M 3/07
327/536
8,311,243 B2 * 11/2012 Tucker ..................... H02M 3/07
330/10
(Continued)

FOREIGN PATENT DOCUMENTS

EP 2688201 A1 1/2014
EP 2897270 A1 7/2015

OTHER PUBLICATIONS

International Search Report and Written Opinion of the International Searching Authority, International Application No. PCT/US2017/059545, dated May 9, 2018.

*Primary Examiner* — An Luu
(74) *Attorney, Agent, or Firm* — Jackson Walker L.L.P.

(57) ABSTRACT

A method of increasing a multiplication ratio of a charge pump, the multiplication ratio defining a relationship between an output voltage of the charge pump and an input voltage of the charge pump, comprising: analyzing a first efficiency of the charge pump when the multiplication ratio is at a first ratio, calculating a second efficiency of the charge pump when the multiplication ratio is a second ratio lesser than the first ratio, and based on the first efficiency and the second efficiency, determining at least one of a target output power and a target output voltage at which to change the multiplication ratio from the second ratio to the first ratio.

16 Claims, 5 Drawing Sheets

(51) Int. Cl.
  *H03F 1/02* (2006.01)
  *H03F 3/72* (2006.01)

(56) References Cited

U.S. PATENT DOCUMENTS

| | | | |
|---|---|---|---|
| 9,136,755 B2* | 9/2015 | Lesso | H02M 3/07 |
| 9,209,757 B1* | 12/2015 | Thandri | H03F 1/0227 |
| 2011/0298545 A1 | 12/2011 | Morimoto et al. | |
| 2014/0055197 A1 | 2/2014 | Khlat et al. | |
| 2014/0057684 A1 | 2/2014 | Khlat | |
| 2018/0109181 A1* | 4/2018 | King | H02M 3/07 |

\* cited by examiner

VARIABLE RATIO CHARGE PUMP WITH PEAK CURRENT AND AVERAGE CURRENT LIMITING CIRCUITRY

CROSS-REFERENCES AND RELATED APPLICATION

The present disclosure claims benefit of U.S. Provisional Patent Application Ser. No. 62/416,971, filed Nov. 3, 2016, which is incorporated by reference herein in its entirety.

FIELD OF DISCLOSURE

The present disclosure relates in general to charge pump power supplies, including without limitation personal audio devices such as wireless telephones and media players, and more specifically, to systems and methods for limiting input current delivered to a charge pump.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a power amplifier for driving an audio output signal to headphones or speakers, and the power amplifier may often be the primary consumer of power in a personal audio device, and thus, may have the greatest effect on the battery life of the personal audio device. In devices having a linear power amplifier for the output stage, power is wasted during low signal level outputs, because the voltage drop across the active output transistor plus the output voltage will be equal to the constant power supply rail voltage. Therefore, amplifier topologies such as Class-G and Class-H are desirable for reducing the voltage drop across the output transistor(s) and thereby reducing the power wasted in dissipation by the output transistor(s).

In order to provide a changeable power supply voltage to such a power amplifier, a charge pump power supply may be used, for example such as that disclosed in U.S. Pat. No. 8,311,243, in which an indication of the signal level at the output of the circuit is used to control the power supply voltage in a Class-G topology. The above-described topology may raise the efficiency of the audio amplifier, in general, as long as periods of low signal level are present in the audio source. Typically in such topologies, a plurality of thresholds define output signal level-dependent operating modes for the charge pump power supply, wherein a different supply voltage is generated by the charge pump power supply in each mode.

In a typical charge pump power supply, a charge pump may operate in accordance with two non-overlapping clock phases of a switching cycle of the charge pump, with different combinations of connections among an input power source to the charge pump (e.g., a battery), a flying capacitor of the charge pump for storing charge, and an output load capacitor which provides the power supply voltage generated by the charge pump. However, one disadvantage of a charge pump is that when switching between multiplication ratios of the charge pump, an average voltage on one or more of the capacitors in one mode of operation may not be equal to the average voltages required of the capacitors for another multiplication ratio. If the average voltage on one of more of the capacitors is higher than the previous mode of operation, the charge pump may need to source a large inrush current from its power source (e.g., a battery). On the other hand, if the average voltage on one or more of the capacitors is lower than the previous multiplication ratio of operation, the charge pump may need to sink large current to its power source. Because of the sizes of capacitors often used in charge pumps, the amount of current that a charge pump may source or sink when switching between multiplication ratios may not be able to be supplied or absorbed by the power source to or from the charge pump, which may lead to system damage. Accordingly, methods and systems for limiting such switching currents are desirable. For example, it may be desirable to manage a peak current and an average current delivered by a power source (e.g., battery) in order to avoid falsely triggering battery protection mechanisms.

SUMMARY

In accordance with the teachings of the present disclosure, certain disadvantages and problems associated with performance of charge pumps have been reduced or eliminated.

In accordance with embodiments of the present disclosure, a method of changing a multiplication ratio of a charge pump may be provided, wherein the multiplication ratio defining a relationship between an output voltage of the charge pump and an input voltage of the charge pump. The method may include determining a first efficiency of the charge pump when the multiplication ratio is at a first ratio, determining a second efficiency of the charge pump existing at a point in time in which the multiplication ratio increased from the first ratio to a second ratio greater than the first ratio, and based on the first efficiency and the second efficiency, determining at least one of a target output power and a target output voltage at which to change the multiplication ratio between the first ratio and the second ratio.

In accordance with these and other embodiments of the present disclosure, a method may include, in a boosted amplifier having a charge pump monitoring a boost output signal and a pulse width modulation output and upon determining, based on the boost output signal and the pulse width modulation output, that the charge pump cannot sustain an output power with an efficiency greater than a threshold efficiency, changing a multiplication ratio of the charge pump, the multiplication ratio defining a relationship between an output voltage of the charge pump and an input voltage of the charge pump.

In accordance with these and other embodiments of the present disclosure, a method may include determining a boost efficiency of a charge pump and deactivating a boosted amplifier comprising the charge pump if the boost efficiency decreases below a threshold efficiency for a time exceeding a threshold period of time.

In accordance with these and other embodiments of the present disclosure, a method may include determining an average of an input current supplied to a charge pump by a source of electrical energy and ceasing draw of current from the source of electrical energy by the charge pump responsive to the average exceeding a threshold current level.

In accordance with these and other embodiments of the present disclosure, a system may include a charge pump and a controller. The charge pump may be configured to operate in a plurality of modes including a first mode in which a multiplication ratio of an output voltage to an input voltage of the charge pump is a first ratio and a second mode in which the multiplication ratio is a second ratio greater than the first ratio. The controller may be configured to change a multiplication ratio of the charge pump between the first ratio and the second ratio by determining a first efficiency of the charge pump when the multiplication ratio is at the first ratio, determining a second efficiency of the charge pump existing at a point in time in which the multiplication ratio is increased from the first ratio to the second ratio, and based on the first efficiency and the second efficiency, determining at least one of a target output power and a target output voltage at which to change the multiplication ratio between the first ratio and the second ratio.

In accordance with these and other embodiments of the present disclosure, a system may include a charge pump and a controller. The charge pump may be configured to operate in a plurality of modes including a first mode in which a ratio of an output voltage to an input voltage of the charge pump is a first ratio and a second mode in which the ratio is a second ratio greater than the first ratio. The controller may be configured to monitor a boost output signal and a pulse width modulation output and upon determining, based on the boost output signal and the pulse width modulation output, that the charge pump cannot sustain an output power with an efficiency greater than a threshold efficiency, change a multiplication ratio of the charge pump between the first ratio and the second ratio.

In accordance with these and other embodiments of the present disclosure, a system may include a charge pump and a controller. The charge pump may be configured to operate in a plurality of modes including a first mode in which a ratio of an output voltage to an input voltage of the charge pump is a first ratio and a second mode in which the ratio is a second ratio greater than the first ratio. The controller may be configured to determine a boost efficiency of a charge pump and deactivate a boosted amplifier comprising the charge pump if the boost efficiency decreases below a threshold efficiency for a time exceeding a threshold period of time.

In accordance with these and other embodiments of the present disclosure, a system may include a charge pump and a controller. The charge pump may be configured to operate in a plurality of modes including a first mode in which a ratio of an output voltage to an input voltage of the charge pump is a first ratio and a second mode in which the ratio is a second ratio greater than the first ratio. The controller may be configured to a controller configured to determine an average of an input current supplied to a charge pump by a source of electrical energy and cause cessation of current drawn from the source by the charge pump responsive to the average exceeding a threshold current level.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are explanatory examples and are not restrictive of the claims set forth in this disclosure.

BRIEF DESCRIPTION OF THE DRAWINGS

A more complete understanding of the example, present embodiments and certain advantages thereof may be acquired by referring to the following description taken in conjunction with the accompanying drawings, in which like reference numbers indicate like features, and wherein.

DETAILED DESCRIPTION

Figure 1:
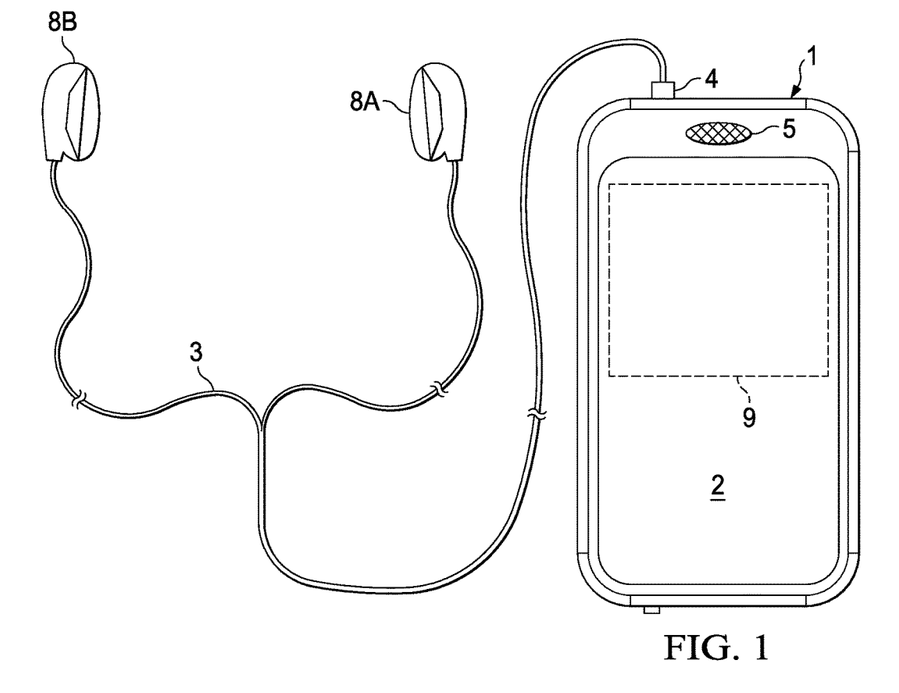
FIG. 1 is an illustration of an example personal audio device, in accordance with embodiments of the present disclosure.

FIG. 1 is an illustration of an example personal audio device 1, in accordance with embodiments of the present disclosure. Personal audio device 1 is an example of a device in which techniques in accordance with embodiments of the present disclosure may be employed, but it is understood that not all of the elements or configurations embodied in illustrated personal audio device 1, or in the circuits depicted in subsequent illustrations, are required in order to practice the subject matter recited in the claims. Personal audio device 1 may include a transducer such as speaker 5 that reproduces distant speech received by personal audio device 1, along with other local audio events such as ringtones, stored audio program material, injection of near-end speech (i.e., the speech of the user of personal audio device 1) to provide a balanced conversational perception, and other audio that requires reproduction by personal audio device 1, such as sources from webpages or other network communications received by personal audio device 1 and audio indications such as a low battery indication and other system event notifications. In addition or alternatively, a headset 3 may be coupled to personal audio device 1 for generating audio. As shown in FIG. 1, a headset 3 may be in the form of a pair of earbud speakers 8A and 8B. A plug 4 may provide for connection of headset 3 to an electrical terminal of personal audio device 1. Headset 3 and speaker 5 depicted in FIG. 1 are merely examples, and it is understood that personal audio device 1 may be used in connection with a variety of audio transducers, including without limitation, captive or integrated speakers, headphones, earbuds, in-ear earphones, and external speakers.

Personal audio device 1 may provide a display to a user and receive user input using a touch screen 2, or alternatively, a standard LCD may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3, speaker 5, and/or another audio transducer.

Figure 2:
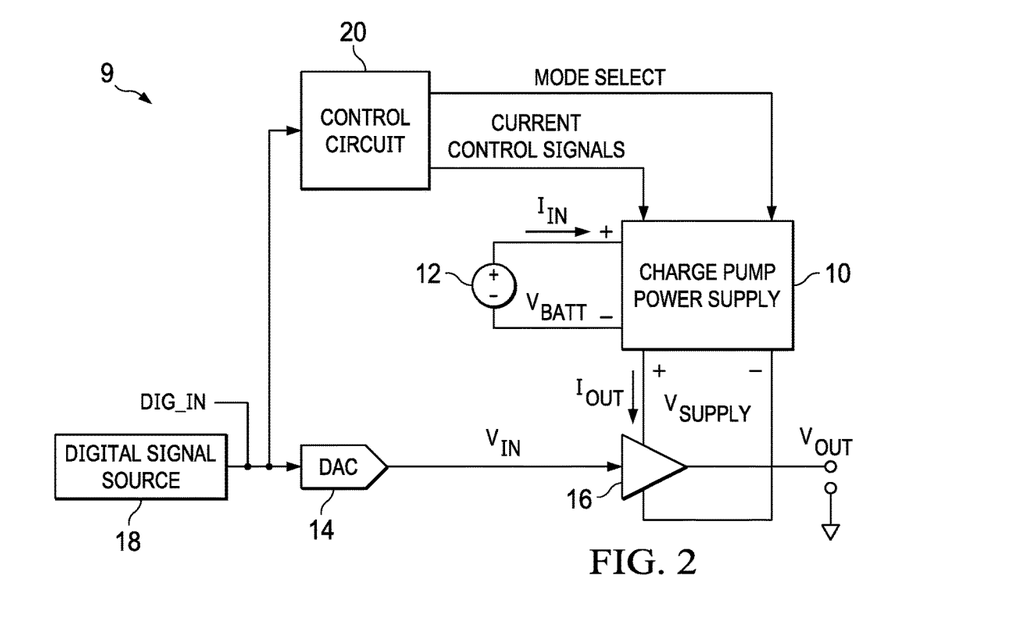
FIG. 2 is a block diagram of selected components of an example integrated circuit, which may be implemented as an audio integrated circuit of the personal audio device depicted in FIG. 1 or any other suitable device, in accordance with embodiments of the present disclosure.

FIG. 2 is a block diagram of selected components of an example IC 9, which may be implemented as audio IC 9 of personal audio device 1 or any other suitable device, in accordance with embodiments of the present disclosure. As shown in FIG. 2, a digital signal source 18 (e.g., a processor, digital signal processor, microcontroller, test equipment, or other suitable digital signal source) may supply a digital input signal DIG_IN to a digital-to-analog converter (DAC) 14, which may in turn convert digital input signal DIG_IN into an equivalent analog input signal $V_{IN}$ and communicate analog input signal $V_{IN}$ to a power amplifier stage 16 which may amplify or attenuate the analog input signal $V_{IN}$ and provide an output signal $V_{OUT}$, which, in embodiments in which digital input signal DIG_IN, analog input signal $V_{IN}$, and output signal $V_{OUT}$ are audio signals, may operate a speaker, headphone transducer, and/or a line level signal output. However, application of IC 9 as depicted in FIG. 2 may not be limited to audio applications. In addition, although amplifier stage 16 is depicted as a single-ended output generating a single-ended audio output signal $V_{OUT}$, in some embodiments, amplifier stage 16 may comprise a differential output, and may thus provide a differential audio output signal $V_{OUT}$.

A charge pump power supply 10 may provide the power supply rail inputs of a supply voltage $V_{SUPPLY}$ to amplifier 16 and may receive a power source input, generally from a battery 12 or other power supply, which may provide an input voltage $V_{BATT}$ to charge pump power supply 10. A control circuit 20 may supply a mode select signal to charge pump power supply 10 that selects an operating mode of charge pump power supply 10 so as to adjust supply voltage $V_{SUPPLY}$ generated by charge pump power supply 10 according to expected and/or actual signal levels at the output of amplifier 16. When low signal levels exist and/or are expected at amplifier output $V_{OUT}$, mode control circuit 20 may improve the power efficiency of audio IC 9 by varying the supply voltage $V_{SUPPLY}$ in conformity with the output signal $V_{OUT}$ or a signal (e.g., digital input signal DIG_IN) indicative of the output signal $V_{OUT}$. Accordingly, to maintain power efficiency, at any given time control circuit 20 may select an operating mode from a plurality of operating modes in each operating mode operating charge pump power supply 10 at a different supply voltage, $V_{SUPPLY}$, wherein the supply voltage $V_{SUPPLY}$ in one operational mode is a rational multiple or ratio of supply voltages of other operational modes.

Figure 3:
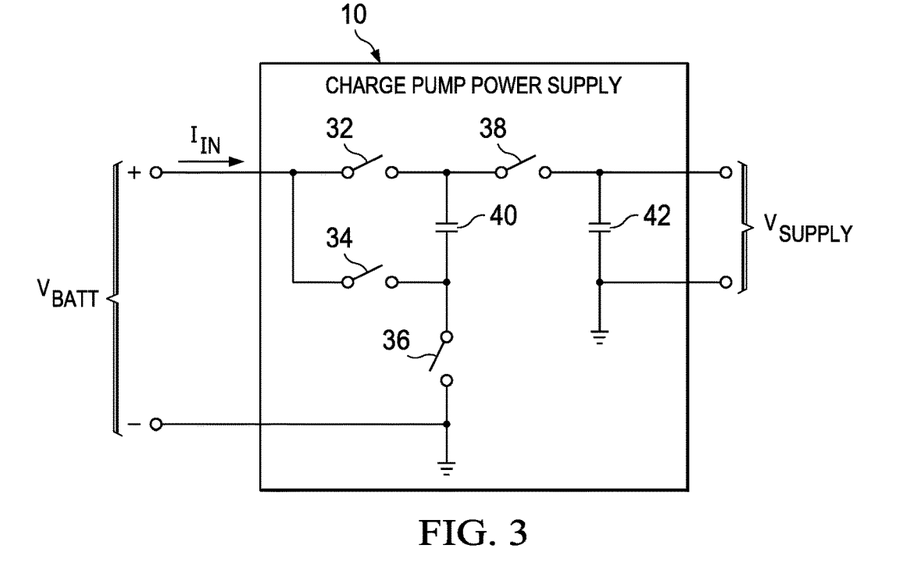
FIG. 3 is a block diagram of selected components of an example charge pump power supply, in accordance with embodiments of the present disclosure.

FIG. 3 is a block diagram of selected components of an example charge pump power supply 10, in accordance with embodiments of the present disclosure. Charge pump power supply 10 as shown in FIG. 3 may be configured to operate in two modes: a first mode in which the supply voltage $V_{SUPPLY}$ output by charge pump power supply 10 is equal to input voltage $V_{BATT}$, and a second mode in which the supply voltage $V_{SUPPLY}$ output by charge pump power supply 10 is equal to two times input voltage $V_{BATT}$. As shown in FIG. 3, charge pump power supply 10 may include switches 32, 34, 36, and 38, a flying capacitor 40, and a charge pump output capacitor 42.

Each switch 32, 34, 36, and 38 may comprise any suitable device, system, or apparatus for making a connection in an electric circuit when the switch is enabled (e.g., closed or on) and breaking the connection when the switch is disabled (e.g., open or off) in response to a control signal received by the switch. For purposes of clarity and exposition, control signals for switches 32, 34, 36, and 38 are not depicted although such control signals would be present to selectively enable and disable switches 32, 34, 36, and 38. In some embodiments, a switch 32, 34, 36, and 38 may comprise an n-type metal-oxide-semiconductor field-effect transistor. In these and other embodiments, a switch 32, 34, 36, and 38 may comprise a p-type metal-oxide-semiconductor field-effect transistor. Switch 32 may be coupled between a positive input terminal of charge pump power supply 10 and a first terminal of flying capacitor 40. Switch 34 may be coupled between the positive input terminal of charge pump power supply 10 and a second terminal of flying capacitor 40. Switch 36 may be coupled between a negative input terminal of charge pump power supply 10 and a second terminal of flying capacitor 40. Switch 38 may be coupled between the first terminal of flying capacitor 40 and a first terminal of charge pump output capacitor 42.

Flying capacitor 40 and charge pump output capacitor 42 may each comprise a passive two-terminal electrical component used to store energy electrostatically in an electric field, which may generate a current in response to a time-varying voltage across the capacitor (or vice versa). Charge pump output capacitor 42 may be coupled between the output terminals of charge pump power supply 10, and thus may store supply voltage $V_{SUPPLY}$ output by charge pump power supply 10.

In the first mode, charge pump power supply 10 may operate in a single phase, wherein switch 34 may be disabled and switches 32, 36, and 38 may be enabled during operation, thus charging voltage $V_{SUPPLY}$ on charge pump output capacitor 42 to input voltage $V_{BATT}$. In the second mode, charge pump power supply 10 may sequentially operate in a charging phase in which switches 32 and 36 are enabled and switches 34 and 38 are disabled, allowing charge transfer from battery 12 to flying capacitor 40, and a transfer phase in which switches 32 and 36 are disabled and switches 34 and 38 are enabled, boosting the voltage on flying capacitor 40 and allowing charge transfer from flying capacitor 40 to charge pump output capacitor 42.

Although FIG. 3 depicts a particular implementation of a charge pump power supply 10 configured to switch between a first mode in which the boost ratio of supply voltage $V_{SUPPLY}$ and input voltage $V_{BATT}$ is 1, and a second mode in which the boost ratio of supply voltage $V_{SUPPLY}$ and input voltage $V_{BATT}$ is 2, the systems and methods herein may generally apply to charge pump power supplies having more than two modes of operation and/or boost ratios other than 1 or 2 (e.g., 1.5, 3, etc.). In addition, although FIG. 3 depicts a particular implementation of a charge pump power supply 10 having switches 32-38, a single flying capacitor 40, and a charge pump output capacitor 42, the systems and methods herein may generally apply to charge pump power supplies having any suitable topology of switches, one or more flyback capacitors, and one or more load capacitors.

As shown in FIGS. 2 and 3, battery 12 may supply a current $I_{IN}$ to charge pump power supply 10, and charge pump power supply 10 may generate a current $i_{out}$ to amplifier 16. As mentioned in the Background section of this application, it may be advantageous to limit the magnitude of the current $I_{IN}$ sourced from or sunk to battery 12 by charge pump power supply 10. Thus, in accordance with methods and systems of the present disclosure, control circuit 20 may also be configured to generate current control signals as shown in FIG. 2 to limit input current $I_{IN}$, as described in greater detail below.

Figure 4:
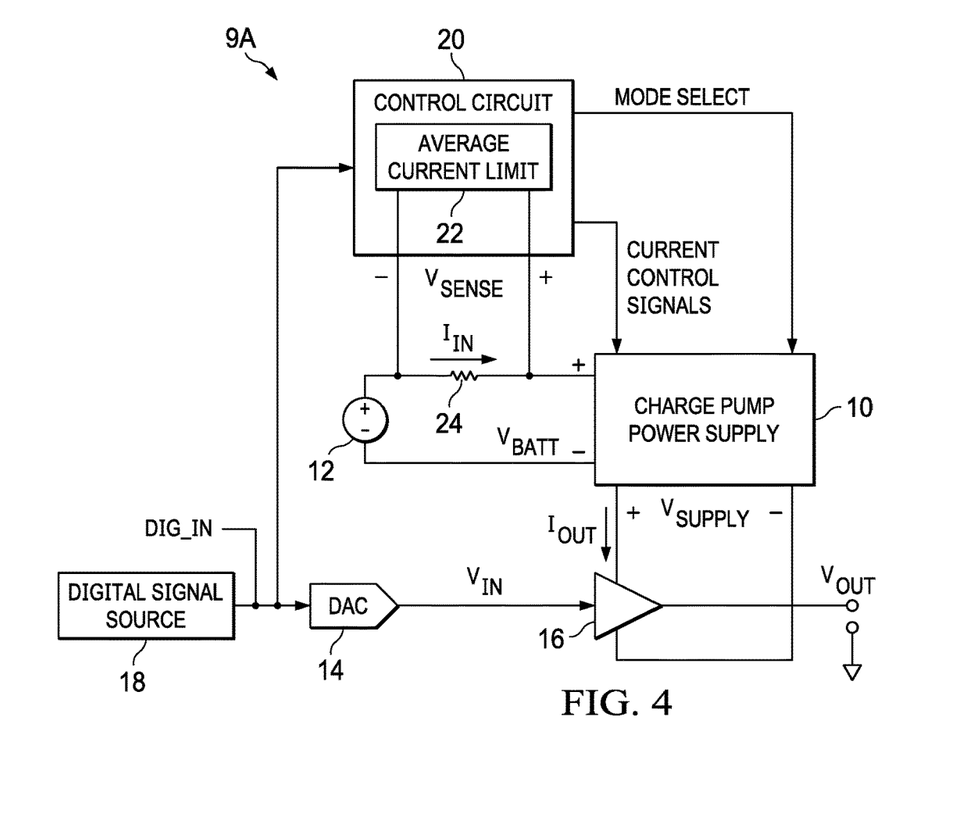
FIG. 4 is a block diagram of selected components of an example integrated circuit, which may be implemented as an audio integrated circuit of the personal audio device depicted in FIG. 1 or any other suitable device, in accordance with embodiments of the present disclosure.

FIG. 4 is a block diagram of selected components of an example IC 9A, which may be implemented as audio IC 9 of personal audio device 1 or any other suitable device, in accordance with embodiments of the present disclosure. Example IC 9A as shown in FIG. 4 may be similar in many respects to audio IC 9 shown in FIG. 2, and thus, only the main differences between example IC 9 and audio IC 9 are discussed. As shown in FIG. 4, IC 9 may include a sense resistor 24 and control circuit 20 may include average current limiting circuitry 22. In operation, average current limit circuitry 22 may detect current $I_{IN}$ based on a sensed voltage $V_{SENSE}$, and based thereon, communicate one or more current control signals to limit an average of current $I_{IN}$.

Figure 5:
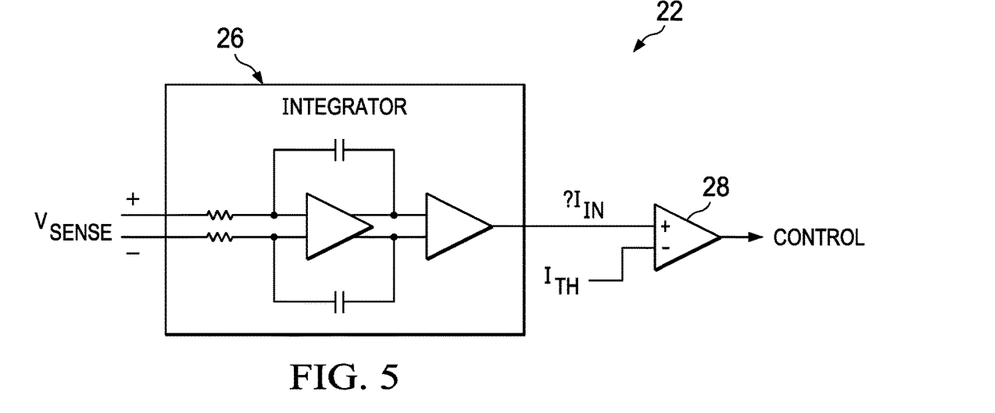
FIG. 5 is a block diagram of an example average current limiting circuitry, in accordance with embodiments of the present disclosure.

FIG. 5 is a block diagram of example average current limiting circuitry 22, in accordance with embodiments of the present disclosure. As shown in FIG. 5, average current limiting circuitry 22 may include a plurality of components arranged as an integrator 26 and a comparator 28. Integrator 26 may, from the beginning of each switching cycle of charge pump power supply 10, integrate signal $V_{SENSE}$ to generate an integrated current $\int I_{IN}$ for such switching cycle. Such integrated current $\int I_{IN}$ may then be compared against a threshold integrated current $I_{TH}$ by comparator 28, which generates at least one control signal CONTROL based on the comparison. Accordingly, the value of a threshold integrated current $I_{TH}$ effectively sets an average current limit for each switching cycle of charge pump power supply 10. Once the current limit is exceeded during a switching cycle, the at least one control signal CONTROL may be used to disable one or more switches of charge pump power supply 10 in order to cease drawing of current by charge pump power supply 10 from battery 12. At the beginning of each switching cycle of charge pump power supply 10, the integrated current $\int I_{IN}$ may be reset to zero through any suitable approach (e.g., shorting the output of integrator to a ground voltage for a finite period of time). In some embodiments, an additional integrator 26 may be employed by average current limiting circuitry 22 to allow for a longer reset time of integrators 26 by alternating the integrator 26 used for integration in alternate switching cycles of charge pump power supply 10.

In addition to limiting average current, control circuit 20 may also be configured to limit peak current of current $I_{IN}$. For example, to control a maximum peak current of current IN, a simple technique of dividing a switch of charge pump power supply 10 into multiple smaller (and higher resistance) switches may be employed. Using such approach, the resistance that is provided on the activation of a switching phase of charge pump power supply 10 may be determined by a maximum voltage across the switch and a maximum peak current that battery 12 can deliver. In order to determine when additional sections of the switch may be activated, a simple self-timing mechanism may measure the voltage across the switch and as the voltage drops below a threshold, an additional section of the switch may be activated while still maintaining current $I_{IN}$ below the maximum peak current limit. This process of comparing the voltage across the parallel switches and activating when the voltage is below a threshold is repeated until all available parallel switches are activated. An additional approach for determining when the parallel switches are activated is by simply using timers to activate each of the switches in the parallel combination. A time threshold can be created for each of the individual switches used in the parallel configuration where each switch is activated after a predetermined time has transpired (where each switch has an individual time threshold—all thresholds can be equal or different from all other time thresholds).

Other methods of controlling the peak current of current $I_{IN}$ may also be utilized. For example, varying a switching frequency of charge pump power supply 10 to decrease an effective output impedance of the charge pump power supply 10 may result in lower peak currents of current $I_{IN}$ being drawn from battery 12. Other approaches for limiting peak current may be described in U.S. patent application Ser. No. 15/783,506, filed Oct. 13, 2017, and incorporated by reference herein.

One problem that may arise from limiting of input current $I_{IN}$ is that it may restrict charge pump power supply 10 from outputting a desired boosted output supply voltage $V_{SUPPLY}$. For example, when transitioning from a first multiplication ratio (wherein the multiplication ratio defines a relationship between output voltage $V_{SUPPLY}$ generated by charge pump power supply 10 and input voltage $V_{BATT}$ of charge pump power supply 10) to a second multiplication ratio higher than the first multiplication ratio, an average current limit applied to charge pump power supply 10 (e.g., by average current limiting circuitry 22) may restrict charge pump power supply 10 from obtaining the desired multiplication at the second multiplication ratio and deliver a required amount of output power at its output. Such restriction may occur as a result of an instantaneous decrease in an efficiency of charge pump power supply 10. To illustrate, if charge pump power supply 10 was operating at 100% efficiency with the first multiplication ratio, the transition to the second multiplication ratio would immediately drop the efficiency of charge pump power supply 10, the new efficiency being approximately equal to the second multiplication ratio divided by the first multiplication ratio. Thus, because the input power delivered by battery 12 is limited due to the input average current limitation, charge pump power supply 10 cannot simultaneously increase the multiplication ratio and deliver the required output power to amplifier 16, resulting in charge pump power supply 10 operating at a much reduced efficiency and being unable to deliver the required output power even though battery 12 is capable of delivering such output power.

To reduce or minimize this problem, control circuit 20 may be configured to select a multiplication ratio based on a required power to be delivered by charge pump power supply 10 and a power headroom based on efficiency of charge pump power supply 10. As a result, transition from a first multiplication ratio to a larger second multiplication ratio may occur at a lower output power (and thus, lower amplifier output voltage $V_{OUT}$) than if input current limiting were not present.

When an output of charge pump power supply 10 is unable to sustain an adequate charge, its output voltage $V_{SUPPLY}$ may collapse, thus resulting in a decrease of an efficiency of charge pump power supply 10. When such a decrease of efficiency occurs, control circuit 20 may cause charge pump power supply 10 to operate at a minimum ratio that can sustain the resulting output voltage $V_{SUPPLY}$. Such decrease may be performed as a protection mechanism to ensure that charge pump power supply 10 is operating at a best possible efficiency under the circumstances while ensuring that charge is still delivered from battery 12 to the output of charge pump power supply 10.

Figure 6:
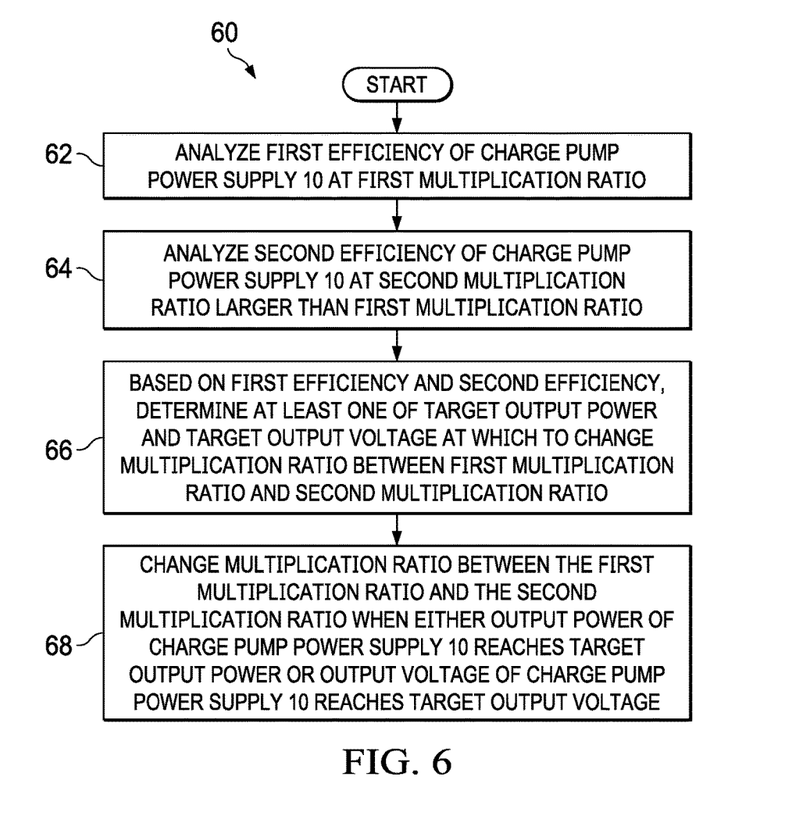
FIG. 6 illustrates a flow chart of an example method for increasing a multiplication ratio of a charge pump power supply, in accordance with embodiments of the present disclosure.

FIG. 6 illustrates a flow chart of an example method 60 for increasing a multiplication ratio of a charge pump power supply, in accordance with embodiments of the present disclosure. According to some embodiments, method 60 may begin at step 62. As noted above, teachings of the present disclosure may be implemented in a variety of configurations of audio IC 9. As such, the preferred initialization point for method 60 and the order of the steps comprising method 60 may depend on the implementation chosen.

At step 62, control circuit 20 may determine a first efficiency of charge pump power supply 10 when its multiplication ratio is a first multiplication ratio. At step 64, control circuit 20 may determine a second efficiency of charge pump power supply 10 existing at a point in time in which the multiplication ratio of charge pump power supply 10 increases from the first ratio to a second ratio greater than the first ratio.

At step 66, control circuit 20 may, based on the first efficiency and the second efficiency, determine at least one of a target output power and a target output voltage at which to change the multiplication ratio between the first multiplication ratio and the second multiplication ratio.

At step 68, in order to limit power supplied by battery 12 to charge pump power supply 10, control circuit 20 may change the multiplication ratio between the first multiplication ratio and the second multiplication ratio when either an output power of charge pump power supply 10 reaches the target output power or an output voltage of charge pump power supply 10 reaches the target output voltage. In addition, to further limit power supplied by battery 12 to charge pump power supply 10, control circuit 20 may limit input current, as described elsewhere in this disclosure.

Although FIG. 6 discloses a particular number of steps to be taken with respect to method 60, method 60 may be executed with greater or fewer steps than those depicted in FIG. 6. In addition, although FIG. 6 discloses a certain order of steps to be taken with respect to method 60, the steps comprising method 60 may be completed in any suitable order.

Method 60 may be implemented using control circuit 20 or any other system operable to implement method 60. In certain embodiments, method 60 may be implemented partially or fully in software and/or firmware embodied in computer-readable media.

As an example application of method 60, referring to charge pump power supply 10 as shown in FIG. 3, charge pump power supply 10 may have a first efficiency $E_{CP1}$ of 100% when operating with a multiplication ratio of 1:1, and have a second efficiency $E_{CP2}$ of 50% immediately when changed to operation with a multiplication ratio of 2:1 (such efficiency may again reach 100% at steady state operation with the multiplication ratio of 2:1). Assuming further that an output power of amplifier 16 (e.g., in FIGS. 2 and 4) is driving a load with a resistance R, the power $P_{OUT}$ onto the load is equal to $V_{OUT}^2/R$. Further, if amplifier 16 operates at an efficiency $E_{AMP}$, charge pump power supply 10 must deliver power $P_{SUPPLY}=V_{OUT}^2/E_{AMP}R$. Assuming a current limit $I_{LIM}$ for input current $I_{IN}$, the power limit $P_{LIM}$ delivered from battery 12 to charge pump power supply 10 is given by $P_{LIM}=V_{BATT}I_{LIM}$. Accordingly, an available power $P_{SUPPLY}$ available immediately at the point of changing from the 1:1 multiplication ratio to the 2:1 multiplication ratio is given by $P_{SUPPLY}=P_{LIM}E_{CP2}/E_{CP2}=V_{BATT}I_{LIM}E_{CP2}/E_{CP1}$. By using these two equations for power $P_{SUPPLY}$ and solving for amplifier output voltage $V_{OUT}$, the result provides a target voltage $V_{TGT}$ for output voltage $V_{OUT}$ at which control circuit may cause a switch in multiplication ratio of charge pump power supply 10 between the 1:1 ratio and the 2:1 ratio, or vice versa. Such target voltage $V_{TGT}$ may be given by:

$$V_{TGT} = \sqrt{\frac{E_{AMP}RV_{BATT}I_{LIM}E_{CP2}}{E_{CP1}}}$$

A target power level $P_{TGT}$ for switching between multiplication ratios may be given as $P_{TGT}=V_{TGT}^2/R$ or alternatively as:

$$P_{TGT} = \frac{E_{AMP}V_{BATT}I_{LIM}E_{CP2}}{E_{CP1}}$$

Thus, target voltage $V_{TGT}$ and/or target power $P_{TGT}$ may set a threshold lower than battery voltage $V_{BATT}$ for changing between multiplication ratios of charge pump power supply 10, such that amplifier 16 is able to supply power to its load while a change in ratio to charge pump power supply 10 occurs.

Figure 7:
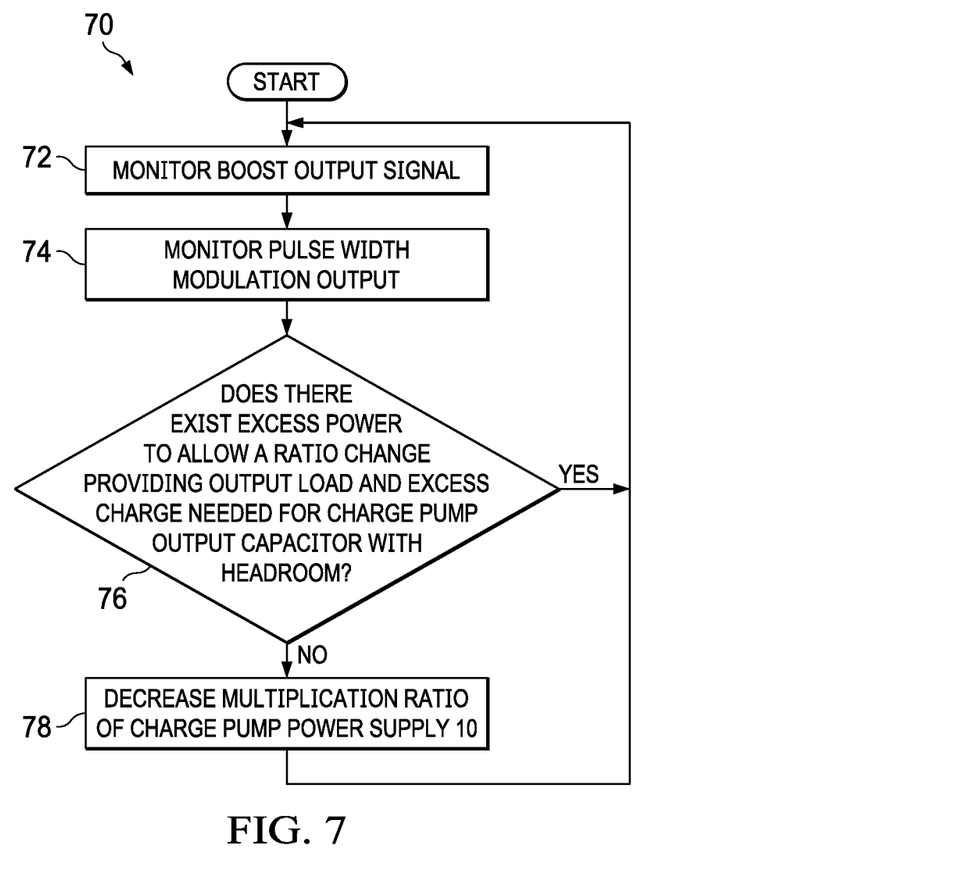
FIG. 7 illustrates a flow chart of an example method for controlling a multiplication ratio of a charge pump power supply, in accordance with embodiments of the present disclosure.

FIG. 7 illustrates a flow chart of an example method 70 for controlling a multiplication ratio of a charge pump power supply, in accordance with embodiments of the present disclosure. According to some embodiments, method 70 may begin at step 72. As noted above, teachings of the present disclosure may be implemented in a variety of configurations of audio IC 9. As such, the preferred initialization point for method 70 and the order of the steps comprising method 70 may depend on the implementation chosen.

At step 72, control circuit 20 may monitor a boost output signal (e.g., supply voltage $V_{SUPPLY}$ in FIG. 2). At step 74, control circuit 20 may monitor a pulse width modulation output (e.g., output voltage $V_{OUT}$ in FIG. 2) or a signal indicative of such pulse width modulation output (e.g., digital input signal DIG_IN).

At step 76, control circuit 20 may determine, based on the boost output signal and the pulse width modulation output, if there exists excess power to allow a multiplication ratio change such that charge pump power supply 10 can support its output load and any excess charge needed for a charge pump output capacitor (e.g., capacitor 42 of FIG. 3) to have adequate headroom. Determinations of step 76 may be based on an input current-limited available power. From this available power, the output power of an output load of amplifier 16, and a loss of efficiency that occurs at the moment a multiplication ratio increases, a "critical" threshold may be determined (for example, as in the target voltage and target power in method 60 described above) at which transition between multiplication ratios must occur. An additional headroom may be applied below this critical power at multiplication ratio changes that are triggered by control circuit 20 to ensure excess power is available to make the transition between multiplication ratios.

If charge pump power supply 10 can sustain the output power greater than the threshold efficiency, method 70 may return to step 72. Otherwise, if charge pump power supply 10 cannot sustain the output power greater than the threshold efficiency, method 70 may proceed to step 78, in which control circuit 20 may cause a decrease in the multiplication ratio of charge pump power supply 10. After completion of step 78, method 70 may return to step 70.

Although FIG. 7 discloses a particular number of steps to be taken with respect to method 70, method 70 may be executed with greater or fewer steps than those depicted in FIG. 7. In addition, although FIG. 7 discloses a certain order of steps to be taken with respect to method 70, the steps comprising method 70 may be completed in any suitable order.

Method 70 may be implemented using control circuit 20 or any other system operable to implement method 70. In certain embodiments, method 70 may be implemented partially or fully in software and/or firmware embodied in computer-readable media.

Figure 8:
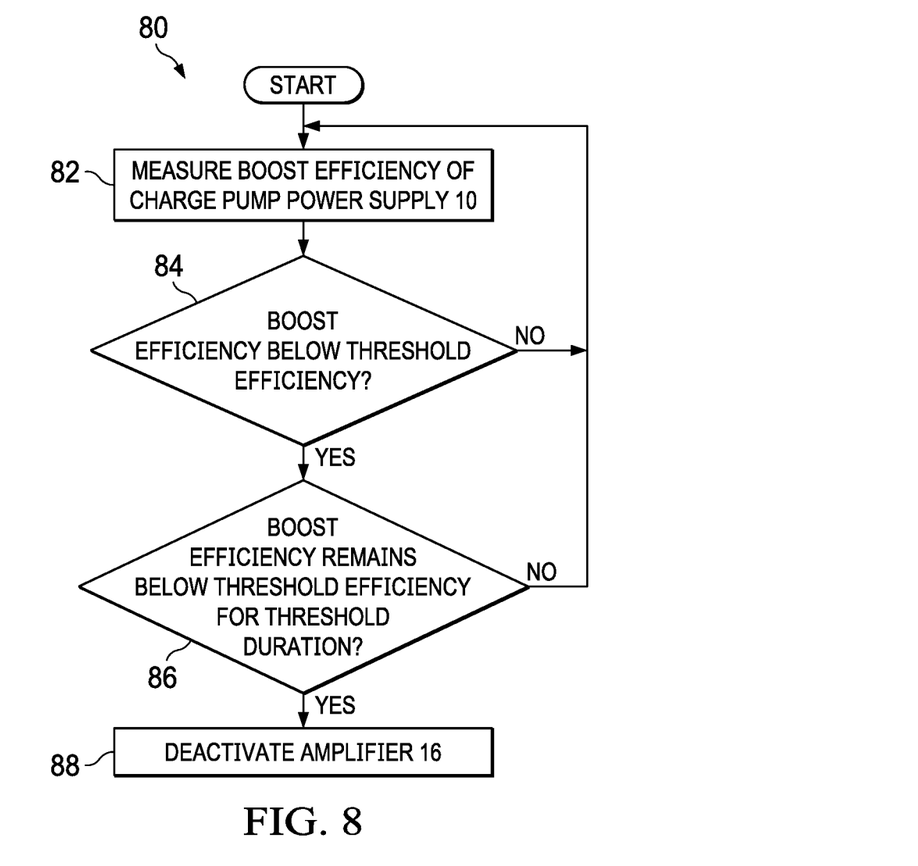
FIG. 8 illustrates a flow chart of an example method for controlling a boosted amplifier, in accordance with embodiments of the present disclosure.

FIG. 8 illustrates a flow chart of an example method 80 for controlling a boosted amplifier, in accordance with embodiments of the present disclosure. According to some embodiments, method 80 may begin at step 82. As noted above, teachings of the present disclosure may be implemented in a variety of configurations of audio IC 9. As such, the preferred initialization point for method 80 and the order of the steps comprising method 80 may depend on the implementation chosen.

At step 82, control circuit 20 may determine a boost efficiency of charge pump power supply 10. The boost efficiency may be calculated by dividing actual supply voltage $V_{SUPPLY}$ by a target supply voltage wherein the target supply voltage is equal to battery voltage $V_{BATT}$ multiplied by the multiplication ratio of charge pump power supply 10. At step 84, control circuit 20 may determine if the boost efficiency is below a threshold efficiency. If the boost efficiency is above the threshold efficiency, method 80 may proceed again to step 82. Otherwise, if the boost efficiency is below the threshold efficiency, method 80 may proceed to step 86. At step 86, control circuit 20 may start a timer, and if the boost efficiency remains below the threshold efficiency for a threshold duration, method 80 may proceed to step 88. Otherwise, if the boost efficiency rises above the threshold efficiency before expiration of the threshold duration, method 80 may proceed again to step 82. At step 88, responsive to the boost efficiency remaining below the threshold efficiency for the threshold duration, control circuit 20 may deactivate amplifier 16.

Although FIG. 8 discloses a particular number of steps to be taken with respect to method 80, method 80 may be executed with greater or fewer steps than those depicted in FIG. 8. In addition, although FIG. 8 discloses a certain order of steps to be taken with respect to method 80, the steps comprising method 80 may be completed in any suitable order.

Method 80 may be implemented using control circuit 20 or any other system operable to implement method 80. In certain embodiments, method 80 may be implemented partially or fully in software and/or firmware embodied in computer-readable media.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding this disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. A method of changing a multiplication ratio of a charge pump, the multiplication ratio defining a relationship between an output voltage of the charge pump and an input voltage of the charge pump, the method comprising:
   determining a first efficiency of the charge pump when the multiplication ratio is at a first ratio;
   determining a second efficiency of the charge pump existing at a point in time in which the multiplication ratio increased from the first ratio to a second ratio greater than the first ratio; and
   based on the first efficiency and the second efficiency, determining at least one of a target output power and a target output voltage at which to change the multiplication ratio between the first ratio and the second ratio.

2. The method of claim 1, further comprising changing the multiplication ratio when at least one of an output power of the charge pump reaches the target output power and the output voltage reaches the target output voltage in order to limit power supplied by a source of electrical energy to the charge pump.

3. The method of claim 2, further comprising limiting power supplied by the source of electrical energy by limiting an input current supplied by the source of electrical energy.

4. A method comprising, in a boosted amplifier having a charge pump:
   monitoring a boost output signal and a pulse width modulation output; and
   upon determining, based on the boost output signal and the pulse width modulation output, that the charge pump cannot sustain an output power with an efficiency greater than a threshold efficiency, changing a multiplication ratio of the charge pump, the multiplication ratio defining a relationship between an output voltage of the charge pump and an input voltage of the charge pump.

5. A method comprising:
   determining a boost efficiency of a charge pump; and
   deactivating a boosted amplifier comprising the charge pump if the boost efficiency decreases below a threshold efficiency for a time exceeding a threshold period of time.

6. A method comprising:
   determining an average of an input current supplied to a charge pump by a source of electrical energy; and
   ceasing draw of current from the source of electrical energy by the charge pump responsive to the average exceeding a threshold current level.

7. The method of claim 6, wherein determining the average comprises mathematically integrating the input current over a switching cycle of the charge pump.

8. The method of claim 6, wherein ceasing draw of current comprises disabling one or more switches of the charge pump responsive to the average exceeding a threshold current level.

9. A system comprising:
a charge pump configured to operate in a plurality of modes including a first mode in which a multiplication ratio of an output voltage to an input voltage of the charge pump is a first ratio and a second mode in which the multiplication ratio is a second ratio greater than the first ratio; and
a controller configured to change a multiplication ratio of the charge pump between the first ratio and the second ratio by:
  determining a first efficiency of the charge pump when the multiplication ratio is at the first ratio;
  determining a second efficiency of the charge pump existing at a point in time in which the multiplication ratio is increased from the first ratio to the second ratio; and
  based on the first efficiency and the second efficiency, determining at least one of a target output power and a target output voltage at which to change the multiplication ratio between the first ratio and the second ratio.

10. The system of claim 9, wherein the controller is further configured to change the ratio when at least one of an output power of the charge pump reaches the target output power and the output voltage reaches the target output voltage in order to limit power supplied by a source of electrical energy to the charge pump.

11. The system of claim 10, wherein the controller is further configured to limit power supplied by the source of electrical energy by limiting an input current supplied by the source of electrical energy.

12. A system comprising:
a charge pump configured to operate in a plurality of modes including a first mode in which a ratio of an output voltage to an input voltage of the charge pump is a first ratio and a second mode in which the ratio is a second ratio greater than the first ratio; and
a controller configured to:
  monitor a boost output signal and a pulse width modulation output; and
  upon determining, based on the boost output signal and the pulse width modulation output, that the charge pump cannot sustain an output power with an efficiency greater than a threshold efficiency, change a multiplication ratio of the charge pump between the first ratio and the second ratio.

13. A system comprising:
a charge pump configured to operate in a plurality of modes including a first mode in which a ratio of an output voltage to an input voltage of the charge pump is a first ratio and a second mode in which the ratio is a second ratio greater than the first ratio; and
a controller configured to:
  determine a boost efficiency of a charge pump; and
  deactivate a boosted amplifier comprising the charge pump if the boost efficiency decreases below a threshold efficiency for a time exceeding a threshold period of time.

14. A system comprising:
a charge pump configured to operate in a plurality of modes including a first mode in which a ratio of an output voltage to an input voltage of the charge pump is a first ratio and a second mode in which the ratio is a second ratio greater than the first ratio; and
a controller configured to:
  determine an average of an input current supplied to a charge pump by a source of electrical energy; and
  cause cessation of current drawn from the source by the charge pump responsive to the average exceeding a threshold current level.

15. The system of claim 14, wherein the controller is configured to determine the average by mathematically integrating the input current over a switching cycle of the charge pump.

16. The system of claim 14, wherein the controller is configured to cause cessation of current drawn by disabling one or more switches of the charge pump responsive to the average exceeding a threshold current level.

* * * * *

UNITED STATES PATENT AND TRADEMARK OFFICE
CERTIFICATE OF CORRECTION

PATENT NO. : 10,114,392 B2
APPLICATION NO. : 15/800743
DATED : October 30, 2018
INVENTOR(S) : Eric J. King, Christian Larsen and Aaron J. Brennan It is certified that error appears in the above-identified patent and that said Letters Patent is hereby corrected as shown below:

In the Specification

Column 7, Line 44-Column 8, Lines 1-3, should read:
In addition to limiting average current, control circuit 20 may also be configured to limit peak current of current $I_{IN}$. For example, to control a maximum peak current of current $\mathbf{I_{IN}}$, a simple technique of dividing a switch of charge pump power supply 10 into multiple smaller (and higher resistance) switches may be employed. Using such approach, the resistance that is provided on the activation of a switching phase of charge pump power supply 10 may be determined by a maximum voltage across the switch and a maximum peak current that battery 12 can deliver. In order to determine when additional sections of the switch may be activated, a simple self-timing mechanism may measure the voltage across the switch and as the voltage drops below a threshold, an additional section of the switch may be activated while still maintaining current $I_{IN}$ below the maximum peak current limit. This process of comparing the voltage across the parallel switches and activating when the voltage is below a threshold is repeated until all available parallel switches are activated. An additional approach for determining when the parallel switches are activated is by simply using timers to activate each of the switches in the parallel combination. A time threshold can be created for each of the individual switches used in the parallel configuration where each switch is activated after a predetermined time has transpired (where each switch has an individual time threshold – all thresholds can be equal or different from all other time thresholds).

Signed and Sealed this
Third Day of November, 2020

Andrei Iancu
*Director of the United States Patent and Trademark Office*